United States Patent
Chang et al.

(10) Patent No.: US 6,286,093 B1
(45) Date of Patent: *Sep. 4, 2001

(54) MULTI-BUS PROGRAMMABLE INTERCONNECT ARCHITECTURE

(75) Inventors: Yi-Chieh Peter Chang, Cupertino; Jia-Jen Michael Lin, San Jose, both of CA (US)

(73) Assignee: Logic Express Systems, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/762,115

(22) Filed: Dec. 10, 1996

(51) Int. Cl.[7] .................................................... G06F 15/00
(52) U.S. Cl. ............................. 712/11; 326/38; 710/126; 327/565
(58) Field of Search ................................ 395/311, 800.11, 395/200.73, 200.81, 800.13, 200.69, 500.01–500.03, 500.08, 500.13–500.18, 500.44; 326/37–41; 712/11–13; 709/238, 239, 243, 244, 251; 359/117, 119; 370/351, 360, 363, 364, 386, 396, 398, 452, 909, 389; 438/128, 598; 379/219–221, 242, 273; 710/119, 120, 126, 128, 131; 711/129; 340/825.03, 827, 825.81–825.9; 257/449; 327/564–566; 716/12–16

(56) References Cited

U.S. PATENT DOCUMENTS

| | | | |
|---|---|---|---|
| 4,815,003 | * 3/1989 | Putatunda et al. | 364/491 |
| 5,036,473 | 7/1991 | Butts et al. | 364/489 |
| 5,255,203 | * 10/1993 | Agrawal et al. | 395/500.17 |
| 5,377,124 | 12/1994 | Mohsen | 364/489 |
| 5,396,126 | * 3/1995 | Britton et al. | 326/41 |
| 5,414,638 | 5/1995 | Verheyen et al. | 364/489 |
| 5,432,708 | * 7/1995 | Mohsen | 395/500.17 |
| 5,448,496 | 9/1995 | Butts et al. | 364/489 |
| 5,457,410 | * 10/1995 | Ting | 326/41 |
| 5,485,103 | * 1/1996 | Pedersen et al. | 326/41 |
| 5,588,152 | * 12/1996 | Dapp et al. | 712/16 |

* cited by examiner

Primary Examiner—John A. Follansbee (57) ABSTRACT

A programmable interconnect system having a plurality of PICs connected via a plurality of buses where each bus may have two or more branches connecting the PICs is disclosed. Generally speaking, for a system with N PICs, there can be N−1 different type of buses having 2 to N corresponding branches to the N PICs. For example, for a four PIC programmable interconnect system, there can be three types of buses connecting the PICs, a two-branch bus, a three-branch bus, and a four-branch bus. Note that the term "bus" refers to one or more signal paths connecting the PICs. For each type of buses, there can be several layouts.

34 Claims, 11 Drawing Sheets

MULTI-BUS PROGRAMMABLE INTERCONNECT ARCHITECTURE

BACKGROUND OF THE INVENTION

1. Field of the Invention

The present invention relates generally to programmable interconnect systems, and more particularly, to methods and systems using programmable interconnect chips and programmable gate arrays, user components, or the like for the purpose of conducting emulation, prototyping, and execution of new electrical circuit designs.

2. Description of the Prior Art

In order to verify a new electrical circuit design by performing system level tests, programmable interconnect systems with programmable interconnect chips (PICs) provide a quick and inexpensive alternative over prototyping the new circuit design on a custom built printed circuit board or in actually making the integrated circuit. New circuit designs can be quickly implemented on a programmable interconnect system where the PICs can be specifically configured to route signals to and from user components in accordance with the circuit design.

One such programmable interconnect system is disclosed in a U.S. Pat. No. 5,036,473, issued on Jul. 30, 1991 to Butts et al. In that system, referring to FIG. 3 of that patent, each logic chip, also referred to as field programmable gate arrays (FPGA), is surrounded by eight routing chips (or PICs) in order to provide maximum flexibility for connectivity among the FPGA chips. The layout of this design is fairly simple and inexpensive because every PIC only connects to its physically adjacent PICs. However, this architecture does not utilize the routing resources in an efficient manner. For example, one of the routing traces in the figure passes through seven of the routing chips and uses fourteen pins, significantly over utilizes the routing resources of the programmable interconnect system.

Another design is illustrated in FIG. 6 of that patent referred to as a partial crossbar interconnect system. In such a system, each logic chip is connected to every crossbar chip (or PIC chip). Although this is a fair design, the architecture requires that each PIC chip connects to each logic chip. When the number of PIC chips increases, the traces for connecting a PIC chip to a remote logic chip would traverse across the circuit board in a highly complicated layout and thereby resulting in a high manufacturing cost. Furthermore, there is no signal path available from one crossbar chip to another crossbar chip.

Another programmable interconnect system is described in a U.S. Pat. No. 5,377,124, issued on Dec. 27, 1994 to Moksen. In that disclosure, referring to FIG. 3b of that patent, a global interconnect architecture is illustrated where each PIC (311-1 to 311-4) is connected to each of the other PICs by means of dedicated conductive 2-branch buses, each containing a selected number of conductive lines (such as 8 or 16 conductive lines). User components in the architecture would be selectively placed adjacent to each PIC and connected to them. This architecture is good for the system where there are a limited number of PICs. For a system having a large number of PICs, this architecture becomes drastically complicated where the buses crisscross in a complex network of interconnects such that an implementation of a large scale version of this architecture would require many additional PCB layers thereby increasing the cost of such interconnect system.

Other architectures are illustrated by FIGS. 3a, 3c, and 3d of that patent. These architectures demonstrate the various possible manners for connecting PICs via buses, and each of these architectures has its particular advantages and weaknesses. For example, the architecture illustrated in FIG. 3a is a less costly architecture but is also a more restrictive architecture than that of FIG. 3b. The PICs are still connected through dedicated 2-branch buses but there may not be a bus between any two PICs to connect two user components. Thus, a signal may need to pass through more than two PICs and be further delayed in the process. For the architecture illustrated by FIG. 3c, although such a common non-dedicated global bus simplifies the interconnections of the PICs, a bus protocol is necessary to manage the conflict calls from the various PICs. With the protocol and conflict management system in place, the performance of such a system is low due to the fact that conflict resolution of bus requests from the various PICs requires additional cycle time thereby slowing down the entire system. Likewise, with regard to the architecture illustrated by FIG. 3d, the center PIC has to be configured in such a manner to manage the communication protocol between it and the surrounding PICs. The addition of such protocol again slows the performance of the system, and the center PIC can easily become the performance bottle neck.

Finally, another programmable interconnect system of interest is described in a U.S. patent, Ser. No. 5,414,638, issued May 9, 1995 to Verheyen et al. Referring to FIG. 2 of that patent, an architecture using two levels of PICs, a global PIC level and a local PIC level, is illustrated. In this system, a signal would have to pass through a local PIC, a global PIC, and another local PIC in order to complete a connection. For a signal to travel from a local PIC to another local PIC, a two level delay is introduced which results in low speed performance.

Overall, current programmable interconnect systems, including the systems described above, fail to recognize some of the key characteristics in circuit designs and the cost factors involved in the manufacturing of a programmable interconnect system.

SUMMARY OF THE INVENTION

It is therefore an object of the present invention to provide a programmable interconnect system having a cost effective balance between the utilization of the PIC pins provided in the system and the manner the interconnects are laid out to connect the pins of the PICs.

It is another object of the present invention to provide a programmable interconnect system having a plurality of PICs connected via a plurality of dedicated buses, where each bus may comprise one or more signal paths.

It is a further object of the present invention to provide a programmable interconnect system having a ring structure.

It is yet another object of the present invention to provide a programmable interconnect system having a ring structure where the PICs are connected via a plurality of dedicated buses having various number of bus branches.

It is still another object of the present invention to provide a programmable interconnect system having a ring structure of PICs which are connected by dedicated buses such that any k physically adjacent PICs can be connect together with a k-branch bus.

Briefly, a programmable interconnect system having a plurality of PICs connected via a plurality of buses where each bus may have two or more branches connecting the PICs is disclosed. Generally speaking, for a system with N PICs, there can be N−1 different type of buses having 2 to N corresponding branches to the N PICs. For example, for a four PIC programmable interconnect system, there can be three types of buses connecting the PICs, a two-branch bus, a three-branch bus, and a four-branch bus. Note that the term "bus" refers to one or more signal paths connecting the PICs.

For each type of buses, there can be several layouts. For example, for a three-branch bus, there are four ways to connect the four PICs. Namely, let the four PICs be labeled PIC1, PIC2, PIC3, and PIC4; the four ways of connecting the PICs would be: PIC1 to PIC2 to PIC3, PIC1 to PIC2 to PIC4, PIC1 to PIC3 to PIC4, PIC2 to PIC3 to PIC4. Similarly, there are six ways of connecting two-branch buses in a four PIC system and only one way of connecting a four-connection bus in the same system. In the preferred embodiment, the PICs are placed in a ring structure formed by the interconnection of the buses.

The architectures of the present invention follow from the locality principle of connectivity which is a novel concept not disclosed in the prior art. This principle is based on the observation that electrical systems are generally designed using a hierarchical structure such that a design is partitioned into several sub-designs, which in turn each sub-design can be further partitioned into several smaller sub-designs, each representing a particular functionality. To implement a particular sub-design for a system, circuitries for carrying out the design would be provided and it would normally consist of a cluster of circuit components where the cluster implements the functionality of a sub-design. Given this design hierarchy, there are relatively many interconnections within a circuit cluster but relatively fewer interconnections among the circuit clusters for interconnecting the clusters.

The routing resources in a programmable interconnect system should therefore have a similar layout as well. The locality principle of connectivity states that an architecture for a programmable interconnect system should arrange PICs in a manner such that the PICs can be clustered to provide matching interconnection resources for clusters of circuit components. Within a cluster of PICs, there should be sufficient amount of routing traces to connect the PICs or to connect the PICs to the corresponding circuit components. Between clusters of PICs, there should be relatively fewer routing traces available for connecting PICs in different clusters.

A variety of implementations of the locality principle is possible including a ring structure as well as other structures described here.

In the ring structured architecture of the present invention, PICs are placed in a manner such that a circle (or ring) is formed. Multiple dedicated buses are used to connect two or more adjacent PICs together along the ring, and additional interconnect traces are used to connect each PIC to corresponding user components. To form conceptual clusters of PICs, one can logically partition the ring into segments where each segment can be thought of as a cluster connecting a corresponding cluster of user components. For example, in a 8-PIC ring structure where the PICs are numbered sequentially from PIC1 to PIC8 and wrapping from PIC8 back to PIC1, if each cluster is to include two PICs, one cluster can include PIC1 and PIC2, another cluster can include PIC3 and PIC4, still another cluster can include PIC5 and PIC6, and yet another cluster can include PIC7 and PIC8. For PICs within the same cluster (which is the case where the PICs are generally physically adjacent each other), more interconnections (i.e., buses with relatively fewer number of branches or shorter length) can be provided to connect the PICs. On the other hand, for PICs that are not in the same cluster (which is the case where the PICs are physically further from each other), fewer interconnections are necessary for connecting the PICs (i.e., buses with relatively more branches or longer length). By such a structure, the invention exploits the principle of locality modeling after the typical hierarchy of a structured circuit design, in which user components are clustered and clusters form even bigger clusters.

In this manner, the architectures of the present invention provide and utilize interconnect resources (i.e. PIC pins and interconnect signal paths) in a most efficient manner tailoring to the most common circuit design architectures. It minimizes two of the most significant cost factors in the manufacturing of programmable interconnect systems.

The first cost factor is the number of pins provided by the PICs where the number of pins generally dictates the number of PICs required for the system. The more PICs used in a system, the higher manufacturing cost for the system. An example is an architecture where a single interconnection trace traverses through several PICs and uses many PIC pins. Thus, it is desirable to minimize the number of pins in order to minimize cost; at the same time utilize the available pins in a most efficient manner.

The second significant cost factor is the manner the signal paths (or interconnects) connecting the pins are routed. If the architecture of a pin system is laid out in a complex manner where significant number of the interconnections are routed in a complicated crisscrossing pattern, the number of printed circuit board layers required to implement such a complicated structure would be high and thereby increasing the manufacturing cost of the system. An architecture where each and every one of the PICs are connected to each other is an example. On the other hand, if the architecture of the system can be laid out in a simple manner requiring minimal amount of crisscrossing of the interconnects, the number of printed circuit board layers required to implement such a system would be correspondingly less and thereby minimizing the manufacturing cost.

The architectures of the present invention minimize these two cost factors by first recognizing, through the recognition of the locality principle, the fact that most circuit designs are laid out in a structure such that user components having many signal pathways connected to each other are typically placed next to or close to each other. An architecture of the programmable interconnect system should therefore, in accordance with the locality principle, have a similar structure as well in order to make the most efficient use of the pins of the PICs. Secondly, the PICs of a programmable interconnect system can be connected via a plurality of interleaving buses having various number of branches connecting the PICs and thereby providing maximum flexibility for interconnecting the user components without providing interconnects among and between all of the PICs. By applying the locality principle of interconnection, the architectures of the present invention successfully increase the utilization of PIC pins while reducing the circuit board layout complexity.

Generally speaking, the embodiments illustrated herein would have the following three characteristics: multiple buses, buses having various numbers of branches, and interleaving of the buses over the PICs.

Thus, an object of the present invention is to provide a programmable interconnect system having a cost effective balance between the utilization of the PIC pins provided in the system and the manner the interconnects are laid out to connect the pins of the PICs.

Another object of the present invention is to provide a programmable interconnect system having a plurality of PICs connected via a plurality of dedicated buses, where each bus may comprise one or more signal paths.

A further object of the present invention is to provide a programmable interconnect system having a ring structure.

Yet another object of the present invention is to provide a programmable interconnect system having a ring structure where the PICs are connected via a plurality of dedicated buses having various number of bus branches.

Still another object of the present invention is to provide a programmable interconnect system having a ring structure of PICs which are connected by dedicated buses such that any k physically adjacent PICs can be connect together with a k-branch bus.

These and other objects and advantages of the present invention will no doubt become obvious to those of ordinary skill in the art after having read the following detailed description of the preferred embodiments.

DETAILED DESCRIPTION OF THE PREFERRED EMBODIMENTS

A basic structure of the present invention comprises a bus having two or more branches to connect two or more corresponding PICs. Within each bus, there may be one or more signal pathways. Each signal pathway may connect to one or more pins of the corresponding PIC, although in most cases a signal pathway is connected to only one pin of the PIC.

Figure 1A:
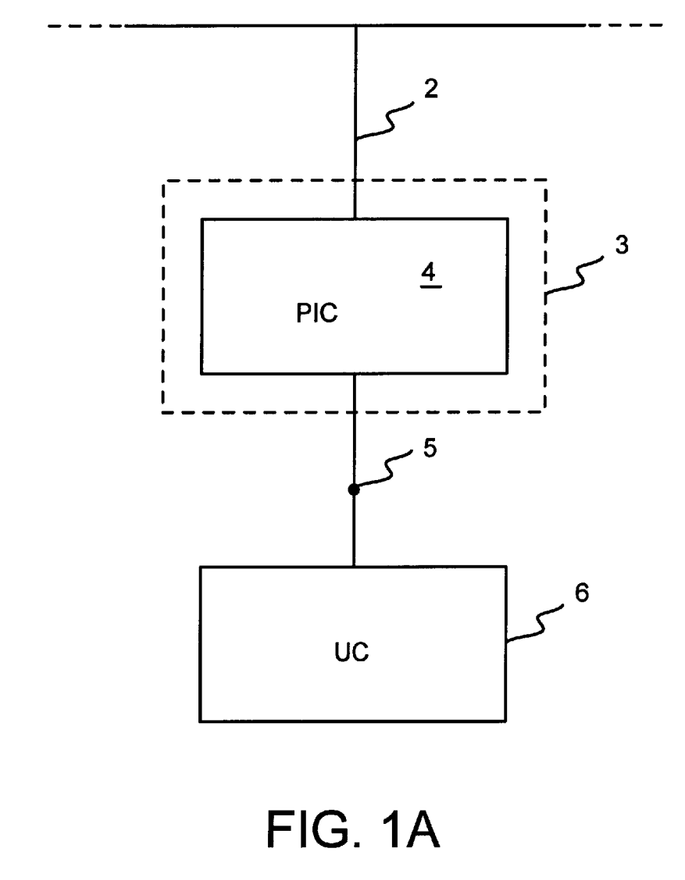
FIG. 1a illustrates a basic structure of the architectures of the present invention.

Referring to FIG. 1a, bus branch of a bus indicated at 2 is connected to PIC 4 which is connected to user component 6 through input/output terminal 5. In certain cases, two or more bus branches from the same bus can be connected to the same PIC 4. Also, in certain cases, an illustrated PIC is a PIC unit (as indicated at 3) having one or more physical PICs which all connect to user component 6. Furthermore, in certain cases, PIC 4 can be connected to one or more user components. It shall be noted that reference to a PIC hereinafter, unless otherwise stated, is a reference to a PIC unit that may contain one or more physical PICs. Further note that each PIC has a number of input/output terminals and the figures do not necessarily depict all or any of the terminals.

Thus, in the basic structure, there may be x-number of buses connected to y-number of PICs to z-number of user components, where x, y, and z may be the same or different.

Generally speaking, to connect two pins of two different user components under the present invention, a signal pathway connects a pin of a first user component to a PIC which is connected to another signal pathway that is connected to the pin of a second PIC, this PIC being connected to another user component. As a result, only four PIC pins are used to make a connection. This is far better than some of the previous architectures in which in order to make a connection between two pins of two user components a connection goes though several PICs and may use many PIC pins in the process.

Figure 1B:
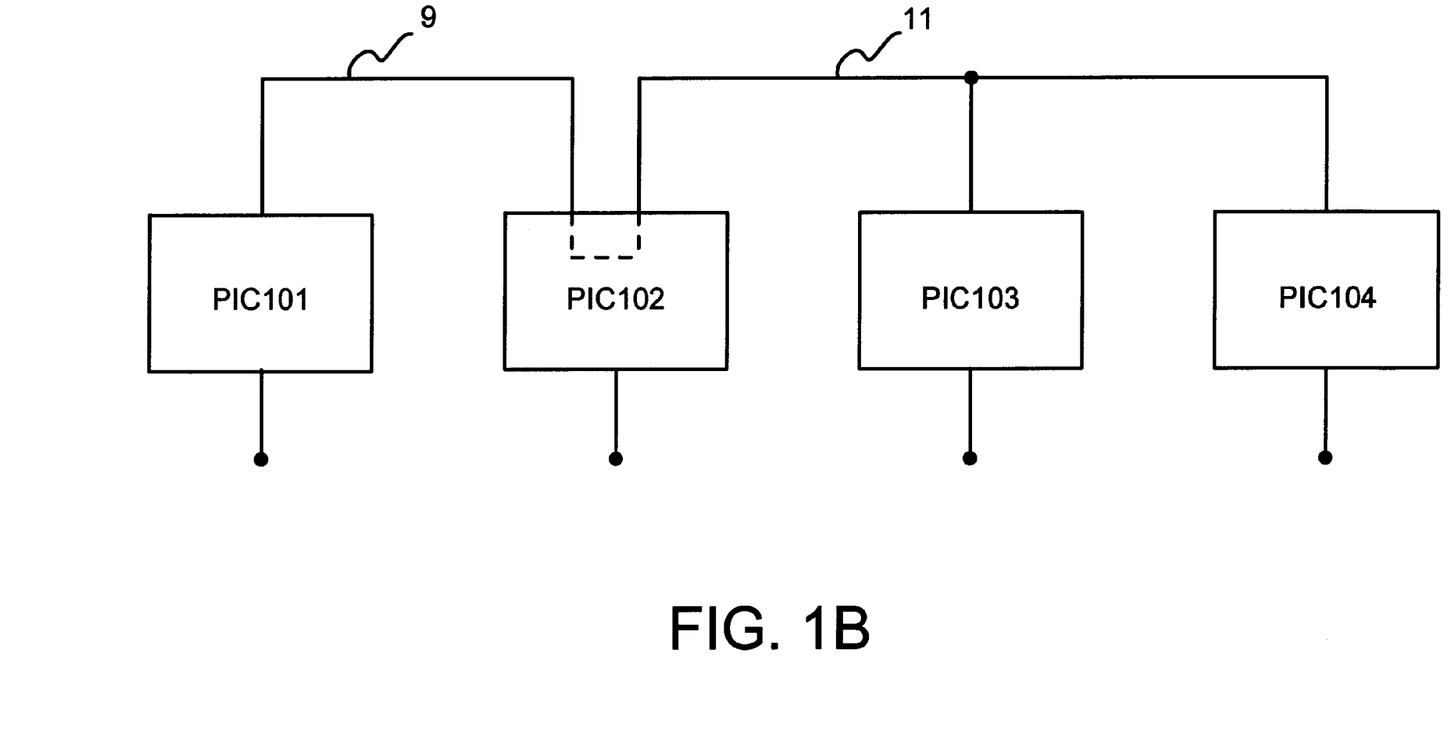
FIG. 1b illustrates the connecting of two buses into one bus.

As a feature of the present invention, referring to FIG. 1b, the signal pathways from two buses can be logically connected by the circuitry within a PIC to form effectively a longer bus (meaning a bus having more branches). As is illustrated, PIC101 and PIC102 are connected by bus 9, and PIC102, PIC103, and PIC104 are connected by bus 11. Each bus may have a number of signal pathways. Since both buses 9 and 11 connect to PIC102, by programming PIC102 accordingly, selected signal pathways from buses 9 and 11 can be connected to form longer buses.

Figure 1C:
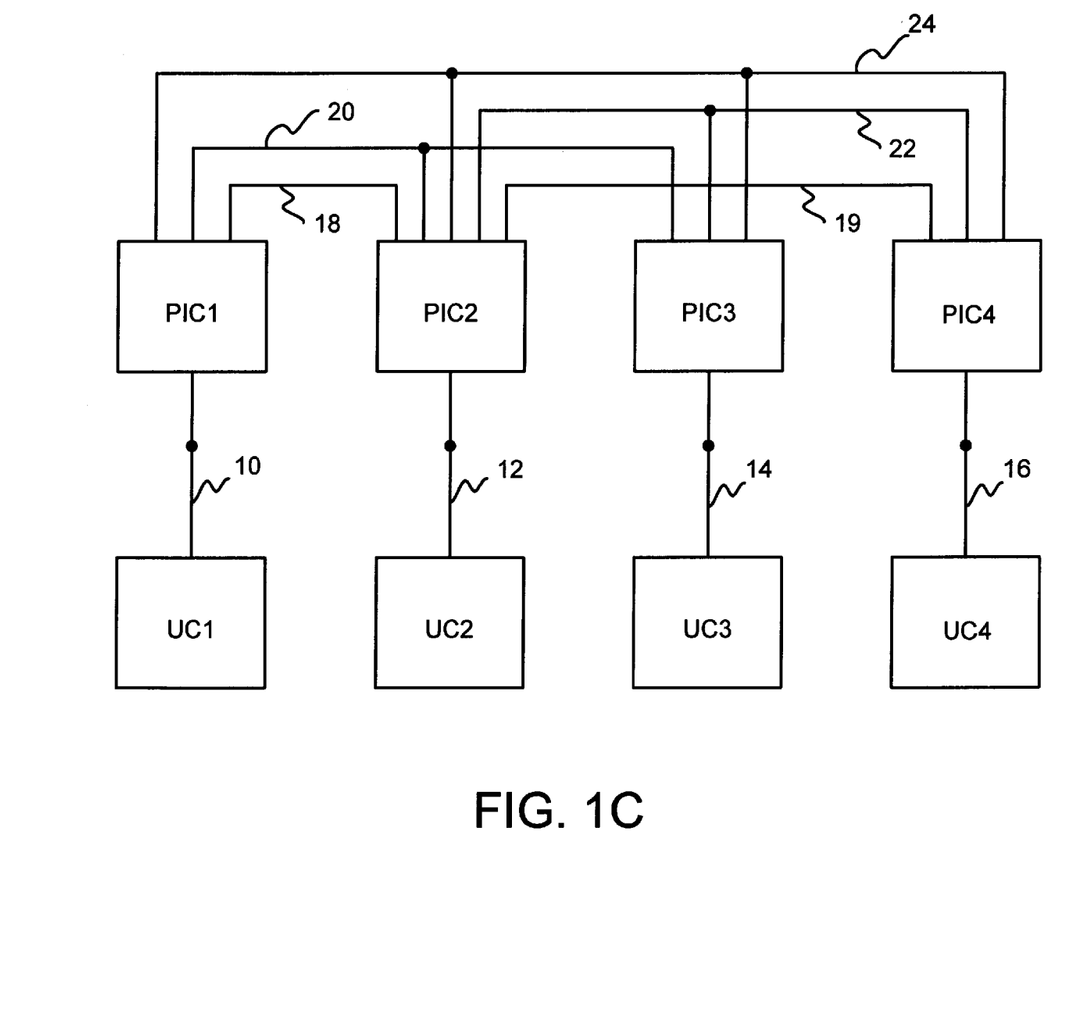
FIG. 1c illustrates a simple architecture connecting PICs using multiple buses of various length.

FIG. 1c illustrates a basic architecture in accordance with the present invention. There are four PICs, PIC1, PIC2, PIC3, and PIC4, each being connected to a user component, UC1, UC2, UC3, and UC4, respectively, via buses as indicated at 10, 12, 14, and 16. The PICs are connected to each other via a plurality of buses having various number of branches as indicated at 18, 19, 20, 22, and 24. Bus 18 is a two-branch bus connecting PIC1 and PIC2. Bus 19 is also a two-branch bus connecting PIC2 and PIC4. Bus 20 is a three-branch bus connection PIC1, PIC2, and PIC3. Bus 22 is also a three-branch bus connecting PIC2, PIC3, and PIC4. Lastly, bus 24 is a four-branch bus connecting all of the PICs. This is one possible architecture of the present invention in which some of the buses are interleaved to connect the PICs. Note that two buses interleave with each other if they each connect to two or more of the same PICS, and an architecture with interleaving buses will have at least two buses interleaving with each other. For example, bus 20 interleaves with bus 22 because both buses connect to PIC2 and PIC3. Similarly, bus 20 interleaves with bus 18, bus 22 interleaves with bus 19, and bus 24 interleaves with buses 18, 19, 20, and 22. On the other hand, bus 18 does not interleave with bus 22, and bus 19 does not interleave with bus 20.

The flexibility of the architectures of the present invention is demonstrated by the following scenarios. Given the architecture illustrated in FIG. 1c where there is only one four-branch bus, if a particular circuit design requires two four-branch buses, a second four-branch bus can be established by combining the two three-branch buses, 20 and 22, or by using the two-branch bus 18 and the three-branch bus 22. On the other hand, the illustrated architecture has two three-branch buses. If a third three-branch bus is needed, the four-branch bus can be programmed to be a three-branch bus. There are many other possible programmable configuration as well. Although not illustrated, there can be additional buses connected to the various PICs, and the buses connection the PICs can be arranged in such a manner to provide a ring architecture or other architectures.

In using the architectures of the present invention, it is important to note that not all of the branches of a signal pathway of a particular bus need to be turned on. Any of the PIC terminals can be programmed to establish a signal pathway to allow a signal to pass through or be programmed to disallow a connection for such signal pathway.

Ring Architecture

Figure 2:
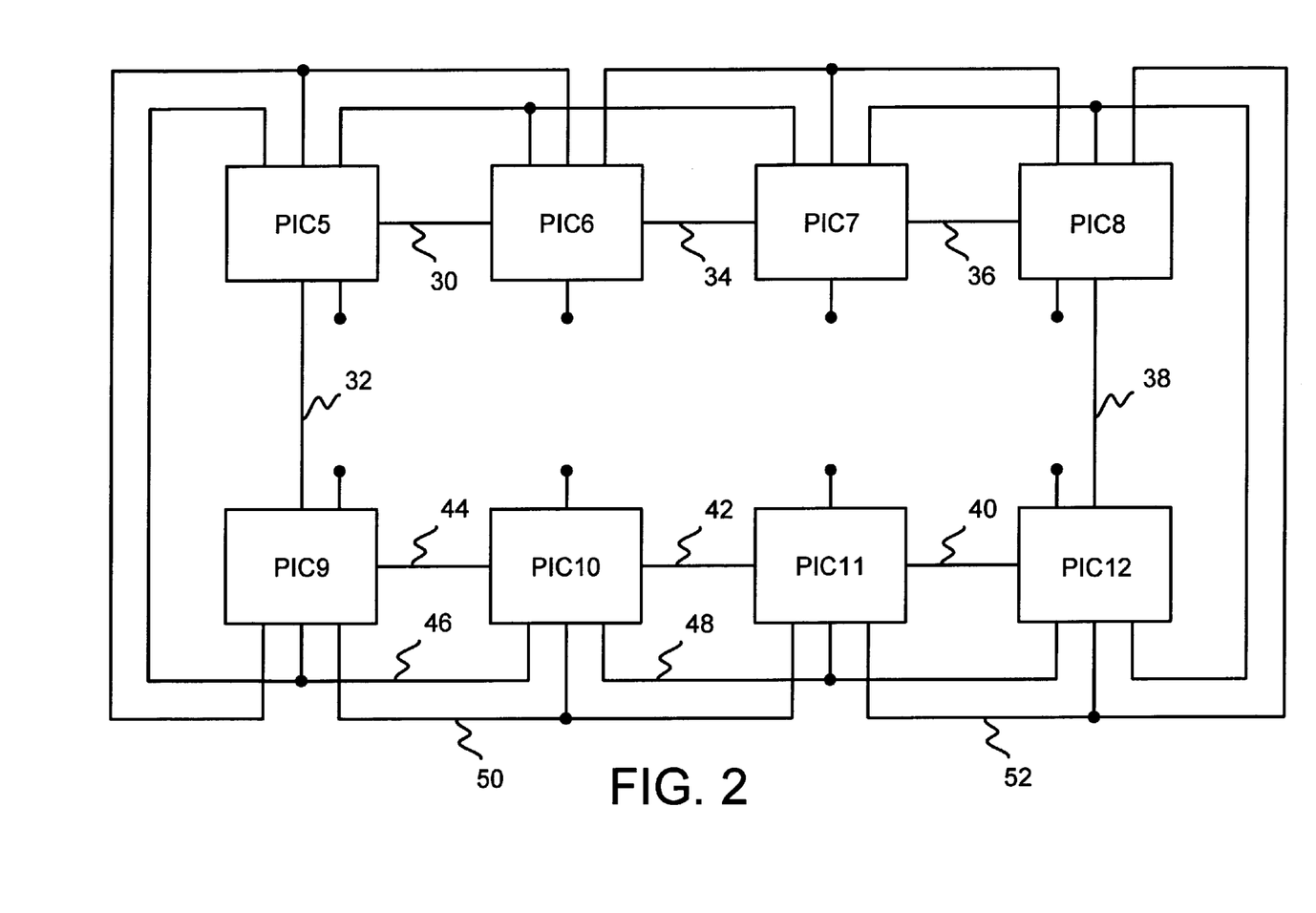
FIG. 2 shows a symmetric ring structure using two-branch and three-branch buses.

Referring to FIG. 2, a symmetrical multi-bus ring architecture of the present invention is illustrated, where the symmetry refers to the fact that each PIC has the same bus connections. In this particular architecture, not all the buses are interleaved with each other. Each PIC is connected to two of its most adjacent PICs via two-branch buses, forming a ring structure. For example, PIC5 is connected to PIC6 via bus 30 and PIC5 is connected to PIC9 via bus 32. In likewise manner, PIC6 is connected to PIC7 via two-branch bus 34, PIC7 is connected to PIC8 via two-branch bus 36, PIC 8 is connected to PIC12 via bus 38, PIC12 is connected to PIC11 via bus 40, PIC11 is connected to PIC 10 via bus 42, and finally, PIC10 is connected to PIC9 via bus 44, thus completing the circular structure.

Additionally, there are also a number of three-branch buses connecting the PICs in an interleaving manner where each PIC is connected to three three-branch buses giving the symmetrical layout. To illustrate, PIC10 is connected to buses 46, 48, and 50 where bus 46 connects PIC5, PIC9, and PIC10, bus 50 connects PIC9, PIC10, and PIC11, and bus 48 connects PIC10, PIC11, and PIC12. Similarly, PIC11 is connected to three buses as well, buses 48, 50, and 52, where bus 52 connects PIC11, PIC12, and PIC8. Each of the PICs in this figure is connected to three three-branch buses where each bus connects three adjacent PICs in the ring structure. This structure conforms to the locality principle by providing buses to connect neighboring PICs to each other (as opposed to providing buses connecting PICs everywhere else in the system). For example, if we need an interconnect system for connecting two clusters of user components together, we can logically partition the PICs in FIG. 2 into two clusters, e.g., PIC5, PIC6, PIC7, and PIC8 in one cluster and the rest of PICs in the other cluster. With such a logical partition, there is more interconnect resource for connecting PICs within a cluster and less interconnect resource for connecting PICs between clusters. For example, there are buses directly connecting any two PICs within a cluster but only some of the PICs in the cluster have a direction bus connection to another PIC in the other cluster. By applying the locality principle, our architectures limit the number of global interconnections and are far better in reducing interconnection layout complexity than some of the previous architectures which require a lot of global interconnections.

In a specific implementation of this architecture, there are 20 signal lines in each of the two-branch buses connecting the PICs, giving a total of 160 (8 buses multiple by 20) two-branch signal lines, and there are 25 signal lines in each of the three-branch buses connecting the physically adjacent PICs, giving a total of 200 (8 buses multiply by 25) three-branch signal lines. In total, there are 360 signal lines in 16 buses.

Figure 3:
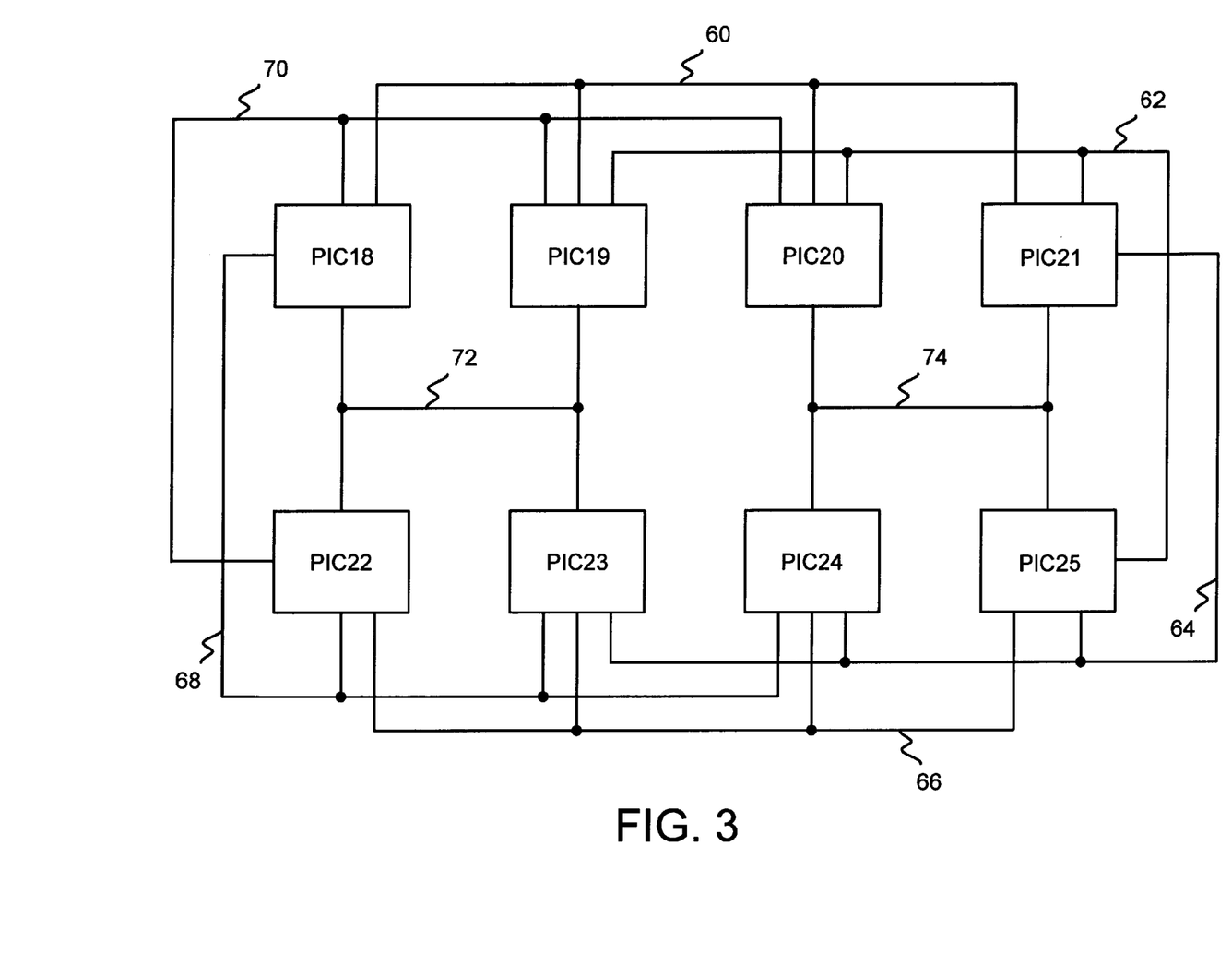
FIG. 3 shows a symmetric ring structure using four-branch buses.

The symmetrical architecture can be implemented using buses having four-branches, five-branches, six-branches, and so on. FIG. 3 illustrates another symmetrical architecture utilizing four-branch buses to connect the PICs. In this architecture, a plurality of buses connect the PICs in an interleaving manner where each bus is connected to four physically adjacent PICs thus forming the ring structure. For example, bus 60 is a four-branch bus connecting PIC18, PIC19, PIC20 and PIC21; bus 62 connects PIC19, PIC20, PIC21, and PIC25; bus 64 connects PIC21, PIC23, PIC24, and PIC25; bus 66 connects PIC22, PIC23, PIC24, and PIC25; bus 68 connects PIC18, PIC22, PIC23, and PIC24; bus 70 connects PIC18, PIC19, PIC20 and PIC22; bus 72 connects PIC18, PIC19, PIC22, and PIC23; and bus 74 connects PIC20, PIC21, PIC24, and PIC25. In a specific implementation of this architecture, there are 30 signal lines in each bus to provide a total of 240 signal lines (8 buses multiply by 30 signal lines).

Figure 4:
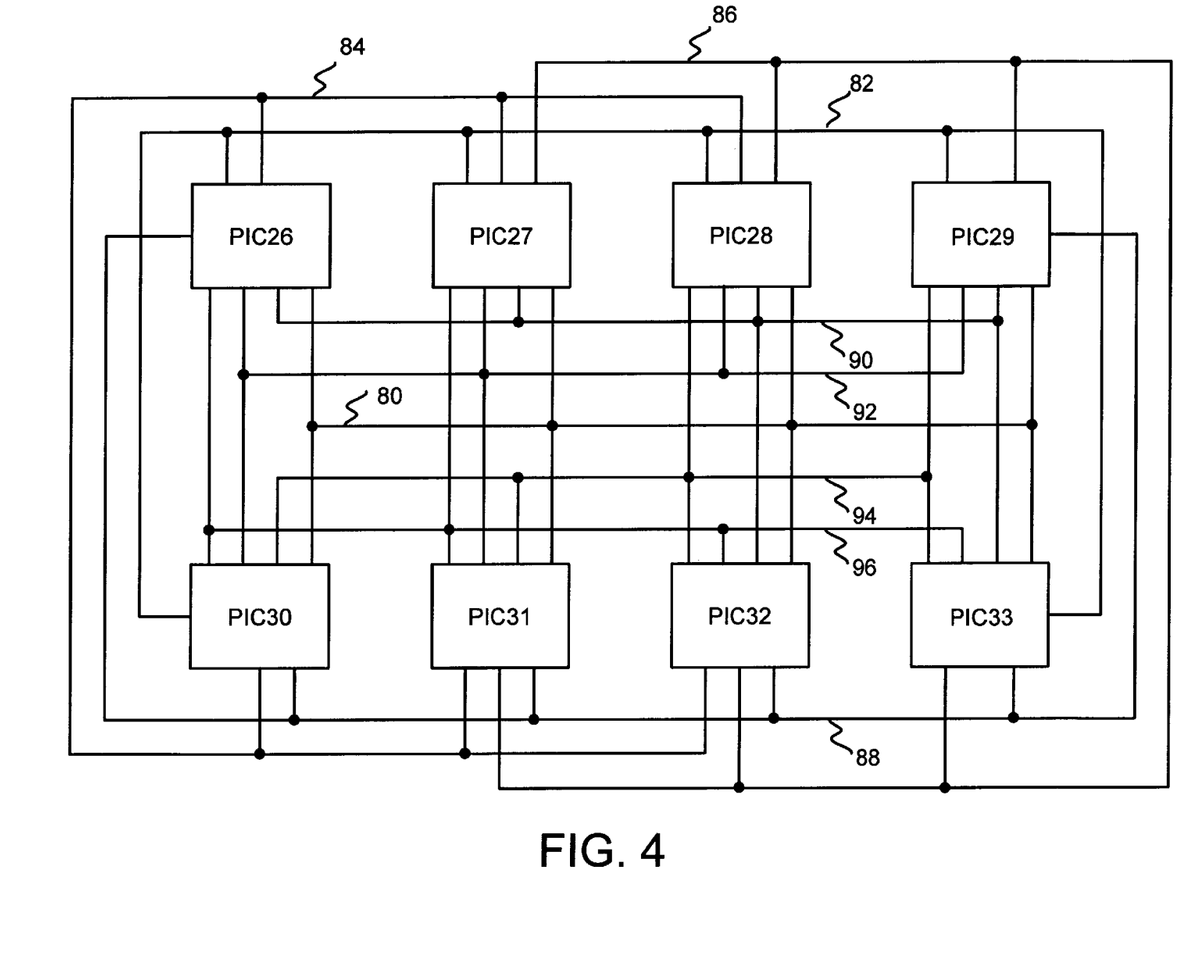
FIG. 4 shows a symmetric ring structure using six-branch buses and an eight-branch bus.

FIG. 4 further illustrates yet another symmetrical architecture of the present invention using six-branch and eight-branch buses. In this architecture, there is one eight-branch bus, bus 80, connecting all of the PICs. There are eight six-branch buses, 82 to 88 and 90 to 96, connecting the PICs to form a ring structure. More specifically, bus 82 connects PIC26, PIC27, PIC28, PIC29, PIC30, and PIC33; likewise, bus 88 connects PIC26, PIC29, PIC30, PIC31, PIC32, and PIC33; bus 84 connects PIC26, PIC27, PIC28, PIC30, PIC31, and PIC32; and bus 86 connects PIC27, PIC28, PIC29, PIC31, PIC32, and PIC33. Furthermore, bus 90 connects PIC26, PIC27, PIC28, PIC29, PIC32, and PIC33; bus 92 connects PIC26, PIC27, PIC28, PIC29, PIC30, and PIC31; bus 94 connects PIC28, PIC29, PIC30, PIC31, PIC32, and PIC33; and bus 96 connects PIC26, PIC27, PIC30, PIC31, PIC32, and PIC33. In a specific implementation of this architecture, there are 15 signal lines in each of the six-branch buses to provide a total of 120 signal lines (8 buses multiply by 15 signal lines), and there are 40 signal lines in the eight-branch bus to provide a total of 40 signal lines.

Figure 5:
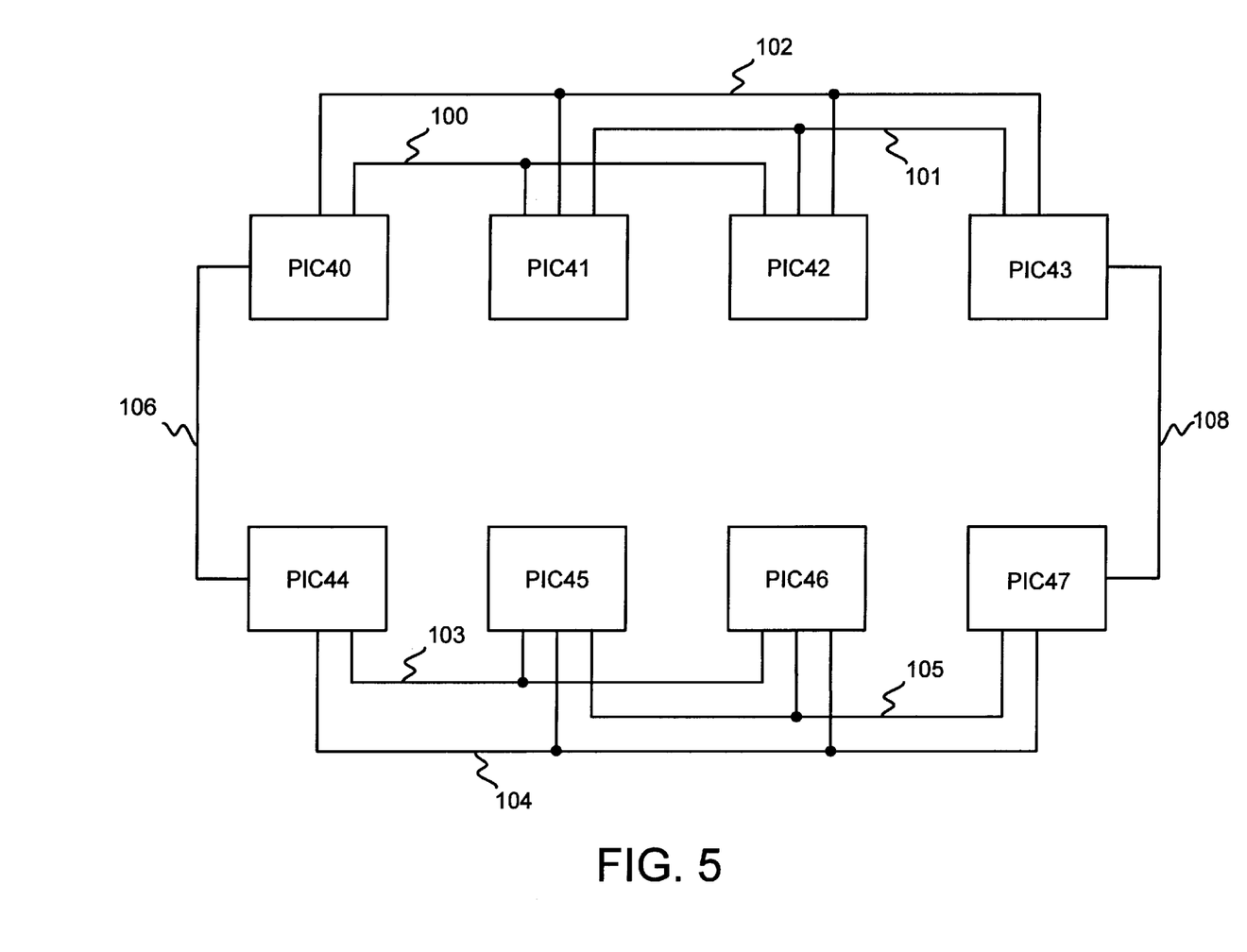
FIG. 5 illustrates a two cluster PIC architecture where the two clusters are connected by two buses.

FIG. 5 illustrates a non-symmetrical ring architecture of the present invention where the PICs do not have the same bus connections. In this architecture, there are two clusters in general. the first cluster includes PIC40, PIC41, PIC42, and PIC43 where the PICs are connected by buses 100, 101, and 102. A second cluster includes PIC44, PIC45, PIC46, and PIC47, where these PICs are connected by buses 103, 104, and 105. The two clusters are connected by buses 106 and 108.

Figure 6A:
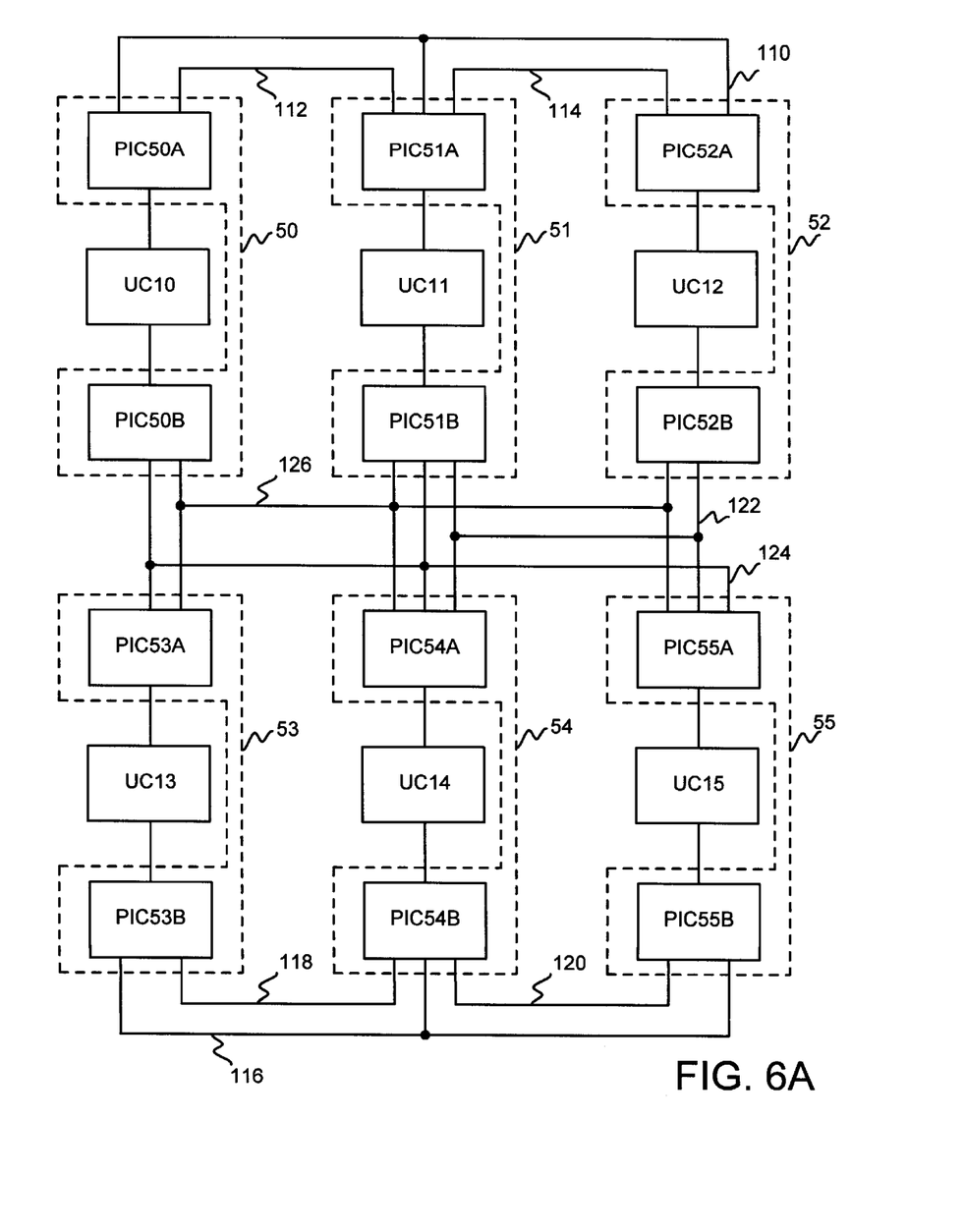
FIG. 6a shows a six-logical PIC ring structure where each logical PIC is comprised of two physical PICs.

FIG. 6a illustrates another architecture of the present invention. In this architecture, each logical PIC is comprised of two physical PICs. For example, PIC50A and PIC50B are two physical PICs forming one logical PIC, so are PIC51A and PIC51B, PIC52A and PIC52B, PIC53A and PIC53B, PIC54A and PIC54B, and PIC55A and PIC55B. In this manner, logical PIC50 is connected to logical PIC51 via bus 112 and is connected to logical PIC51 and logical PIC52 via bus 110. Logical PIC51 is connected to logical PIC52 via bus 114. These logical PICs, PIC50, PIC51 and PIC52, can be referred to as a cluster.

Similarly, logical PIC52, logical PIC53, logical PIC54, and logical PIC55 can be viewed as a cluster where logical PIC53 is connected to logical PIC54 via bus 118, and connected to logical PIC54 and logical PIC55 via bus 116. Furthermore, bus 120 connects logical PIC54 and logical PIC55. The two clusters are connected via bus 122 which is a four-branch bus, bus 124 which is a five-branch, and bus 126 which is a six-branch bus.

It is important to note the special features in the layout of this architecture. In this architecture, the user components (UC10 to UC15) are placed between the two physical PICs of each logical PIC to allow unobstructed interconnections between the physical PICs and the respective user components. This layout also minimizes unnecessary and protracted routing of the interconnections. Furthermore, the buses for connecting the two logical clusters are routed between the two clusters in order to avoid protracted routing of the wires. In contrast, the buses for connecting the PICs of each respective cluster is placed away from the other cluster to minimize complexity in the routing of the buses.

Figure 6B:
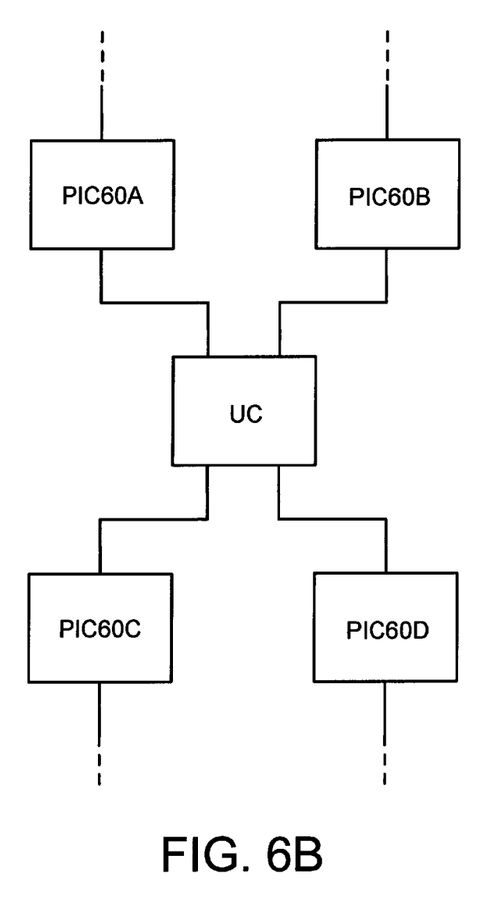
FIG. 6b shows a logical PIC comprised of four physical PICs where the physical PICs are laid out in a particularly advantageous fashion.

In yet another illustration, referring to FIG. 6b, a logical PIC, PIC 60, is comprised of four physical PICs, PIC60A to PIC60D, in connecting a user component. Note that there are two PICs on two sides of the user component as opposed to having a PIC on each side of the user component. This layout is particularly advantageous since by placing the PICs on two sides rather than four sides the routing of buses can be done in an orderly manner.

Design Considerations—The Conservative Approach

The designs of the architectures of the present invention attempt to mirror, to a certain extent, the circuit layouts of actual systems. However, in actually designing a programmable interconnect system, as is demonstrated below, routing resources are provided and allocated in such a manner to provide maximum flexibility and accommodation for a wide variety of possible system architectures. In addition to the laying out of the buses in the manner described above, the architectures of the present invention can also be further configured by providing different number of signal pathways to be distributed for each bus type or a particular bus.

First of all, for comparison purpose, the typical distribution of nets (or buses) for a system having eight user components is listed in Table 1.

TABLE 1

| Bus Type (# of Branches) | Typical Distribution % | Number of Signal Pathways |
| --- | --- | --- |
| 2 | 45% | 342 |
| 3 | 35% | 266 |
| 4 | 10% | 76 |
| 5 | 5% | 38 |
| 6 | 2% | 15 |
| 7 | 2% | 15 |
| 8 | 1% | 8 |
| Total | 100% | 760 |

Table 1 shows that, in a typical distribution for a system having eight user components, two-branch nets generally constitute 45% of all the nets in the system resulting in 342 two-branch nets in a typical distribution of 760 nets. The typical distribution for other types of nets are listed as well.

In order to provide for a typical distribution of nets as listed above, an embodiment of an architecture of the present invention may be implemented as is listed in Table 2.

TABLE 2

| Bus Type (# of Branches) | # of Signal Pathways |
| --- | --- |
| 2 | 160 |
| 3 | 200 |
| 4 | 240 |
| 6 | 120 |
| 8 | 40 |
| Total | 760 |

This embodiment is an example of an application of the conservative approach in designing an architecture of the present invention. This approach dictates that since a bus having relatively fewer branches can be substituted by a bus having relatively more branches and a bus having relatively more branches can be established by two or more buses having relatively fewer branches, a balance can therefore be reached in the design of a programmable interconnect system between the bus type provided in the system, the number of signal pathways for each bus type, and the distribution of these signal pathways, in order to maximize flexibility in connectivity of the user components and to reduce manufacturing cost. Referring to Table 1 and 2 to illustrate this approach, although typically there are 342 two-branch signal pathways, only 160 two-branch signal pathways are provided in the embodiment listed by Table 2. The difference between the two is acceptable because two-branch signal pathways can be substituted by any signal pathways having three or more branches. Similarly, even though the typical distribution would have about 266 three-branch signal pathways, the embodiment listed by Table 2 shows only 200 three-branch signal pathways.

Moreover, the reason to have fewer two-branch and three-branch buses than the statistical norm is because buses with fewer branches have relatively restrictive usages. For example, in a specific application where the buses are provided according to the statistical norm, if two PICs use less than the statistical number of 2-branch connections, then some of their two-branch buses are not used and are considered wasted. This also implies that two other PICs will need more than the statistical number of 2-branch connections and the number of two-branch buses allocated these two other PICs will not be enough. As a result, the system may not have sufficient interconnections. To increase the chance of providing sufficient number of interconnections for all applications, the preferred embodiment provides less than the statistical numbers of two-branch and three-branch buses. Instead, additional four-branch, six-branch, and eight-branch buses are provided to have greater system flexibility in having longer length buses and to substitute for the relatively lower number of two-branch and three-branch buses.

For four-branch signal pathways, the typical distribution would have 76 of such signal pathways. In the embodiment listed by Table 2, 240 four-branch buses are provided for use as two-branch, three-branch, or four-branch signal pathways. This is also the case for six-branch and eight-branch signal pathways in the embodiment listed by Table 2.

Table 2 lists only one possible distribution of the bus types. Other distributions are entirely within the scope of the present invention.

Two and Three Dimensional Ring Structures

The ring structures illustrated above are generally referred to as one-dimensional ring structures where each PIC is connected to neighboring PICs in forming the ring structure. Two and three dimensional ring structures can also be constructed and implemented in accordance with the present invention.

Figure 7:
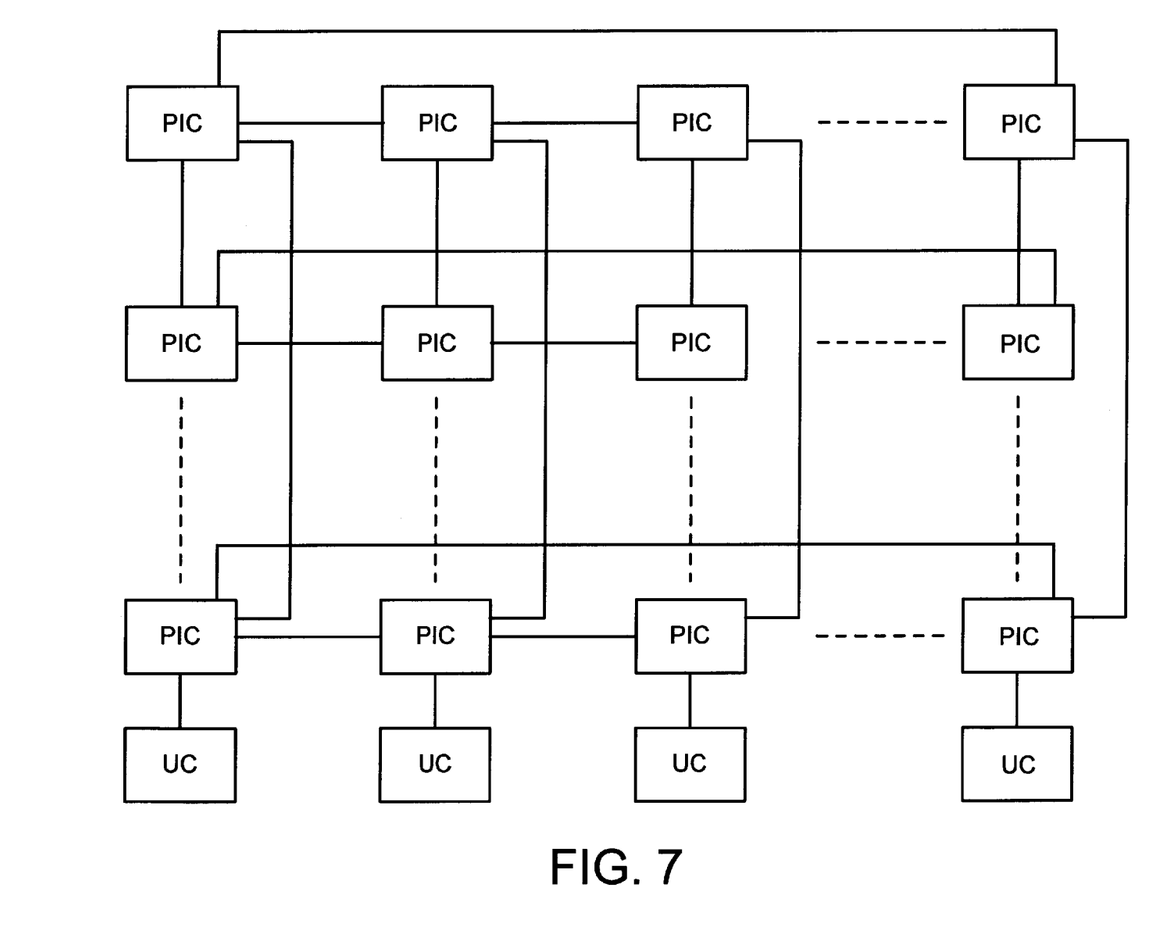
FIG. 7 illustrates the layout for a two-dimensional ring structure.
Figure 8:
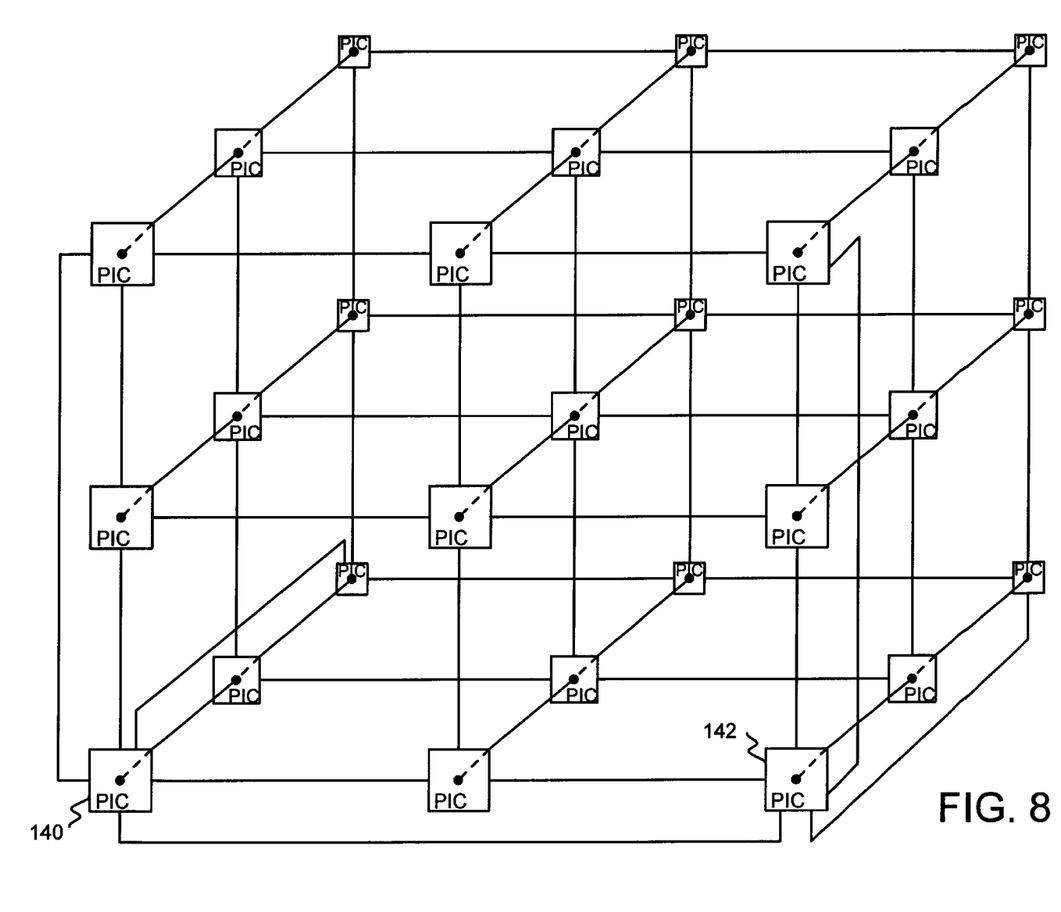
FIG. 8 illustrates the layout for a three-dimensional ring structure.

For a two-dimensional ring structure, referring to FIG. 7, each PIC is connected to four other PICs in forming the ring structure. A two-dimensional ring structure can be constructed using two or more one-dimensional structures stacked on top of each other on a plane where each PIC is also connected to the PIC directly above and directly below and the PIC at the bottom layer is connected to the PIC at the top most layer. For a three-dimensional ring structure, referring to FIG. 8, each PIC is connected to six other PICs in forming the ring structure. In order to keep the figure uncluttered, only two PICS, 140 and 142, are illustrated as being connected to six other PICs. A three-dimensional ring structure can be constructed using two or more two-dimensional structures stacked on top of each other where each PIC is also connected to the PiC directly above and directly below, where the PIC at the bottom layer is connected to the PIC at the top most layer and vice versa.

Multiplexing of the Buses

So far as described, the buses used in the present invention are dedicated buses. Buses can be also used as a shared resource through time multiplexing. In this case, time is clocked into several phases and buses connect different PICs in different phases. With time multiplexing, a protocol needs to be implemented in the PICs to control the time multiplexing.

The disadvantage in time multiplexing is that it introduces additional hardware programming complexity in the PICs to handle the time multiplexing. The advantage is that the number of buses and PICs can be significantly reduced. For example, a five-branch bus can be time multiplexed into two or more three-branch buses where any of these three-branch buses and the original five-branch bus can be activated at different time phases. One consequence of time multiplexing in this case is that the number of three-branch buses can therefore be reduced or eliminated entirely because they can be implemented with the five-branch buses at a different time phase. The result is an overall reduction in the number of buses in the system.

Finally, the implementation of the architectures described above is not restricted to printed circuit boards. The architectures can be done on a chip level or on a multi-chip module (MCM) level.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What is claimed is:

1. A programmable interconnect system for selectively interconnecting user components, comprising:
   a plurality of programmable interconnect units each having a plurality of programmable input and output terminals for routing signals to and from user components and among the programmable interconnect units; and
   a plurality of interleaving buses each including one or more signal pathways connecting the terminals of two or more of said programmable interconnect units, wherein each of said buses connects adjacent ones of said programmable interconnect units, and some of said plurality of buses connect different combinations of at least three or more of said plurality of adjacent programmable interconnect units in an interleaving manner.

2. A programmable interconnect system as recited in claim 1 wherein the signal pathways of all of said buses have the same number of branches.

3. A programmable interconnect system as recited in claim 2 wherein the buses connect the programmable interconnect units in an interleaving manner forming a ring structure.

4. A programmable interconnect system as recited in claim 3 wherein the buses connect the programmable interconnect units in an interleaving manner forming a symmetrical ring structure.

5. A programmable interconnect system as recited in claim 3 wherein the buses connect the programmable interconnect units in a manner to form a two-dimensional ring structure.

6. A programmable interconnect system as recited in claim 3 wherein the buses connect the programmable interconnect units in a manner to form a three-dimensional ring structure.

7. A programmable interconnect system as recited in claim 1 wherein the signal pathways of some of said buses have different numbers of branches.

8. A programmable interconnect system as recited in claim 7 wherein the buses connect the programmable interconnect units in an interleaving manner to form a ring structure.

9. A programmable interconnect system as recited in claim 8 wherein the buses connect the programmable interconnect units in an interleaving manner forming a symmetrical ring structure.

10. A programmable interconnect system as recited in claim 8 wherein the buses connects the programmable interconnect units in a manner to form a two-dimensional ring structure.

11. A programmable interconnect system as recited in claim 8 wherein the buses connects the programmable interconnect units in a manner to form a three-dimensional ring structure.

12. A programmable interconnect system as recited in claim 1 wherein certain ones of said buses connect neighboring programmable interconnect units to form clusters of programmable interconnect units, and certain other ones of said buses further connect said clusters.

13. A programmable interconnect system as recited in claim 12 wherein relatively more buses connect said programmable interconnect units forming said clusters than buses connect said clusters.

14. A programmable interconnect system as recited in claim 1 wherein each of said programmable interconnect units is comprised of one or more physical programmable interconnect chips.

15. A programmable interconnect system as recited in claim 1 wherein said programmable interconnect units include a number of physical programmable interconnect chips that are evenly distributed on two opposite sides of a user component for connecting the user component.

16. A programmable interconnect system as recited in claim 1 wherein selected one of said programmable interconnect unit is programmed to connect two or more of selected ones of said buses.

17. A programmable interconnect system as recited in claim 1 wherein selected ones of said programmable interconnect units connected to the same bus are time-multiplexed.

18. A programmable interconnect system, comprising:
   a plurality of programmable interconnect units each having a plurality of programmable input and output terminals for routing signals to and from user components and among the programmable interconnect units; and
   a plurality of interleaving buses each including one or more signal pathways connecting the terminals of two or more of said programmable interconnect units, wherein each of said buses connects programmable interconnect units that are physically adjacent to each other, and some of said buses connect different combinations of at least three or more of said plurality of adjacent programmable interconnect units in an interleaving manner.

19. A programmable interconnect system as recited in claim 18 wherein the signal pathway of all said buses have the same number of branches.

20. A programmable interconnect system as recited in claim 19 wherein said buses connect said programmable interconnect units in an interleaving manner to form a ring structure.

21. A programmable interconnect system as recited in claim 20 wherein the buses connect said programmable interconnect units in an interleaving manner to form a symmetrical ring structure.

22. A programmable interconnect system as recited in claim 20 wherein the buses connect the programmable interconnect units in a manner to form a two-dimensional ring structure.

23. A programmable interconnect system as recited in claim 20 wherein the buses connect the programmable interconnect units in a manner to form a three-dimensional ring structure.

24. A programmable interconnect system as recited in claim 18 wherein the signal pathway of some of said buses have different numbers of branches.

25. A programmable interconnect system as recited in claim 24 wherein the buses connect the programmable interconnect units in an interleaving manner to form a ring structure.

26. A programmable interconnect system as recited in claim 25 wherein the buses connect the programmable interconnect units in an interleaving manner forming a symmetrical ring structure.

27. A programmable interconnect system as recited in claim 25 wherein the buses connect the programmable interconnect units in a manner to form two-dimensional ring structure.

28. A programmable interconnect system as recited in claim 25 wherein the buses connect the programmable interconnect units in a manner to form three-dimensional ring structure.

29. A programmable interconnect system as recited in claim 18 wherein certain ones of said buses connect neighboring programmable interconnect units to form clusters of programmable interconnect units, and certain other ones of said buses further connect said clusters.

30. A programmable interconnect system as recited in claim 29 wherein relatively more buses connect said programmable interconnect units within each said cluster than buses connect said clusters.

31. A programmable interconnect system as recited in claim 18 wherein each of said programmable interconnect units includes one or more physical programmable interconnect chips.

32. A programmable interconnect system as recited in claim 18 wherein a programmable interconnect unit is comprised of a number of physical programmable interconnect chips that are evenly distributed on two opposite sides of a user component for connecting the using component.

33. A programmable interconnect system as recited in claim 18 wherein selected one of said programmable interconnect unit connects two or more of selected ones of said buses.

34. A programmable interconnect system as recited in claim 18 wherein selected ones of said programmable interconnect units connected to the same bus are time-multiplexed.

* * * * *